US010952330B2

(12) United States Patent
Singh et al.

(10) Patent No.: US 10,952,330 B2
(45) Date of Patent: Mar. 16, 2021

(54) REPAIRING DEFECTIVE THROUGH-HOLES

(71) Applicant: INTERNATIONAL BUSINESS MACHINES CORPORATION, Armonk, NY (US)

(72) Inventors: Prabjit Singh, Poughkeepsie, NY (US); Daniel J. Kearney, Ulster Park, NY (US)

(73) Assignee: International Business Machines Corporation, Armonk, NY (US)

(*) Notice: Subject to any disclaimer, the term of this patent is extended or adjusted under 35 U.S.C. 154(b) by 213 days.

(21) Appl. No.: 16/255,879

(22) Filed: Jan. 24, 2019

(65) Prior Publication Data

US 2020/0245469 A1 Jul. 30, 2020

(51) Int. Cl.
| | |
|---|---|
| *B23K 35/00* | (2006.01) |
| *B23K 1/00* | (2006.01) |
| *H05K 3/22* | (2006.01) |
| *H05K 1/09* | (2006.01) |
| *H05K 1/11* | (2006.01) |
| *H05K 3/42* | (2006.01) |

(Continued)

(52) U.S. Cl.
CPC ........... *H05K 3/225* (2013.01); *B23K 1/0016* (2013.01); *B23K 35/302* (2013.01); *H05K 1/09* (2013.01); *H05K 1/115* (2013.01); *H05K 3/42* (2013.01); *B23K 2101/42* (2018.08); *H05K 2203/0195* (2013.01); *H05K 2203/043* (2013.01); *H05K 2203/045* (2013.01); *H05K 2203/086* (2013.01); *H05K 2203/1115* (2013.01)

(58) Field of Classification Search
CPC B23K 1/0018; B23K 1/002; B23K 2101/001; B23K 26/106; B23K 26/28; B23K 35/0244; B23K 35/404; B23K 3/087
See application file for complete search history.

(56) References Cited

U.S. PATENT DOCUMENTS

| | | | | |
|---|---|---|---|---|
| 2,603,593 | A | * 7/1952 | Blickensderfer | ........ C25D 5/00 205/102 |
| 5,290,970 | A | 3/1994 | Currie | |

(Continued)

OTHER PUBLICATIONS

Sarnacki et al., "Defective Hole Repair/Hermetic Seal", IP.com No. IPCOM000051537D, Feb. 1, 1981.

*Primary Examiner* — Erin B Saad
(74) *Attorney, Agent, or Firm* — Gregory M. Nordstrom

(57) ABSTRACT

A method for repairing a through-hole includes inserting a repair coil, comprising a tightly-wound repair strip, into a through-hole and inserting a heating element into the repair coil. Passing an electrical current through the heating element liquefies a bonding material disposed on the repair coil and the repair coil expands within the through-hole. Subsequently solidifying the bonding material bonds the repair coil to the through-hole. A repair assembly comprises a repair coil inserted into a through-hole and a heating element inserted into the repair coil. The repair coil comprises a tightly-wound repair strip. The heating element comprises a segment of a heating wire enclosed within an insulating material. Passing an electric current through the segment of the heating wire liquefies bonding material disposed on the repair coil and the repair coil expands within the through-hole. The liquified bonding material solidifies to bond the repair coil to the through-hole.

9 Claims, 8 Drawing Sheets

(51) Int. Cl.
    *B23K 35/30*         (2006.01)
    *B23K 101/42*      (2006.01)

(56) References Cited

U.S. PATENT DOCUMENTS

| | | |
|---|---|---|
| 5,809,641 A | 9/1998 | Crudo et al. |
| 6,349,871 B1 | 2/2002 | Card, Jr. et al. |
| 6,443,739 B1 | 9/2002 | Currie |
| 6,453,549 B1 | 9/2002 | Bhatt et al. |
| 6,539,618 B1 | 4/2003 | Lyke |
| 6,555,761 B2 | 4/2003 | Amir |
| 6,784,377 B2 * | 8/2004 | Chamberlin ............ H05K 3/225 |
| | | 174/262 |
| 7,086,870 B1 * | 8/2006 | Sutcliffe ................ H01R 4/028 |
| | | 439/75 |
| 7,987,587 B2 | 8/2011 | Becker et al. |
| 9,913,382 B2 * | 3/2018 | Sidhu ..................... H05K 3/422 |
| 10,729,016 B1 * | 7/2020 | Singh ..................... H05K 1/115 |
| 2016/0118361 A1 * | 4/2016 | Karpati ............. H01L 23/49827 |
| | | 257/689 |

* cited by examiner

REPAIRING DEFECTIVE THROUGH-HOLES

BACKGROUND

The present disclosure relates to through-holes in printed circuit boards, and more specifically, to defective through-holes in printed circuit boards.

SUMMARY

According to the present disclosure (hereinafter, "the disclosure"), in embodiments of the disclosure (hereinafter, "embodiments"), a repair assembly can comprise a repair coil inserted into a through-hole and a heating element inserted into the repair coil. The repair coil can comprise a repair strip tightly-wound into a coil geometry. A bonding material can be disposed on the repair coil. The heating element can comprise a heating wire having a segment of the heating wire enclosed within an insulating material.

The heating wire can be connected to a current source and the current source can pass an electric current through the heating wire. The electric current causes the segment of the heating wire enclosed within the insulating material to produce heat. The heat liquefies the bonding material disposed on the repair coil, and the repair coil expands within the through-hole. Cooling the liquified bonding material solidifies the bonding material to bond the repair coil to a surface of the through-hole.

In some embodiments, the through-hole can be a plated through-hole, the repair strip can comprise an electrically conductive material, and the bonding material can comprise an electrical solder and/or an adhesive material to bond the repair coil to the through-hole. Also, in embodiments, the insulating material can comprise an electrically insulating material and/or a material that does not adhere to the bonding material disposed on the repair coil. In some embodiments, the heating element is removable from the repair coil subsequent to liquefying the bonding material within the through-hole.

Embodiments can include a method. The method can include inserting a repair coil into a through-hole and inserting a heating element into the repair coil. The repair coil can comprise a tightly-wound repair strip and a bonding material disposed on the repair coil. The method can further include passing an electrical current through the heating element to liquefy the bonding material disposed on the repair coil. According to the method, liquefying the bonding material expands the repair coil within the through-hole. The method further includes cooling the bonding material to solidify the liquefied bonding material, within the through-hole, to bond the expanded repair coil to a surface of the through-hole. In some embodiments, the method further includes removing the heating element from the repair coil subsequent to liquefying the bonding material.

The above summary is not intended to describe each illustrated embodiment or every implementation of the disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
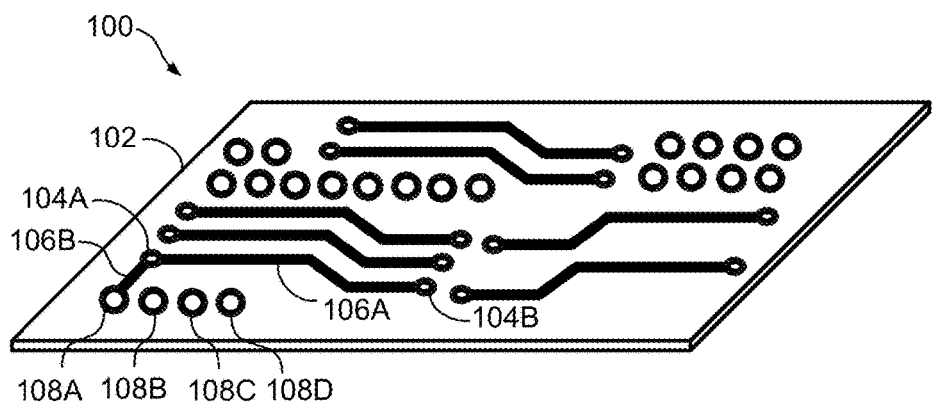
FIG. 1A illustrates an example printed circuit board, according to aspects of the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure (hereinafter, "the disclosure") relate to through-holes in a substrate, such as a plated through-hole (PTH), or "via", of a printed circuit board (PCB). More particular aspects relate to repairing defects in through-holes of a substrate, such as repairing a via, of a PCB. While the disclosure is not necessarily limited to such applications, various aspects of the disclosure may be appreciated through a discussion of various examples using this context. The terminology used herein is intended to explain the principles of the embodiments, the practical application or technical improvement over technologies found in the marketplace, and/or to enable others of ordinary skill in the art to understand the embodiments disclosed herein.

In electronic applications PCBs can be used to mount and/or interconnect electronic components of an electronic system or device. In embodiments of the disclosure (hereinafter, "embodiments"), PCBs can comprise a non-conductive (e.g., a resin material) substrate layer having conductive "traces" implemented on one or both surfaces of the substrate, and can include conductive "vias" extending into, or through-holes, formed in the substrate layer. As used herein, but not intended to limit embodiments, a substrate layer is considered to have, in a vertical frame of reference, a "top" and "bottom" surface of an interior non-conductive substrate material. Additionally, as used herein, "conductive" refers to the property of being electrically conductive.

In embodiments, conductive traces can connect to component connections of a PCB and act as "wires" to conduct electrical power and/or electronic circuit signals between component connections and/or other traces (e.g., traces on another surface of the same or a different substrate layer within a particular PCB). "Multi-layer" PCBs can additionally, in embodiments, comprise multiple, successive substrate layers "sandwiched" together, each of which can include traces and/or vias on one or both of their respective top and bottom surfaces.

As used herein, but not intended to limit embodiments, "via" refers to an electrically conductive (e.g., copper) through-hole extending into or through one or more substrate layers of a PCB. In embodiments a substrate layer of a PCB can have traces on one or, alternatively, both top and bottom surfaces. "Component vias" can extend into or, alternatively, through a substrate layer (or, successive substrate layers of a multi-layer PCB) to receive connections (e.g., pins) of a component device, and "micro vias" can extend from one surface (e.g., a top surface) of a substrate layer to another surface (e.g., a bottom surface) of that same layer, or in a multi-layer PCB, to a surface of a successive substrate layer. Embodiments can also include "blind vias", which can extend from a surface (e.g., a top surface) of a substrate into, but not completely through, one or more substrate layers.

Traces and/or vias of a PCB, in an embodiment, can be copper or, another metal or conductive material. In embodiments, through-holes to form a via (hereinafter, "via holes") can be pre-formed (e.g., drilled) into a substrate layer, in any particular geometry (e.g., cylindrical, conical, or rectilinear), and/or orientation through or within a substrate layer, to form a conductive via. Application (e.g., by electro-plating, gas or liquid deposition, etc.) of a conductive material onto the substrate can include application of the conductive material into via holes to form a conductive path between a conductive region of a via, on one surface of a substrate layer, and a conductive region of that via on another surface of the same and/or other substrate layer. For example, in an embodiment conductive copper alloys can be electro-plated onto a substrate layer having pre-formed via holes to form vias.

FIG. 1A depicts example PCB 100 comprising substrate layer 102 having traces and vias that can be formed by, for example, electro-plating copper to surfaces of substrate layer 102. In FIG. 1A, trace 106A is shown connecting vias 104A and 104B. In embodiments a PCB, such as 100, can also include traces on the bottom surface (not shown in FIG. 1A) and vias, such as 104A and/or 104B, can be micro vias that connect traces on the top surface of substrate 102 to traces on the bottom surface of substrate 102. In embodiments, PCB 100 can be a multi-layer PCB and substrate layer 102 can be one of a successive set of substrate layers forming PCB 100. Vias such as 104A and/or 104B, in such a multi-layer PCB, can pass through all of the layers forming multi-layer PCB 100, or can be blind vias that pass into, but not through, one or more of successive layers of a multi-layer that includes PCB 100.

FIG. 1A also depicts substrate 102 including component vias, such as 108A, 108B, 108C, and 108D, which can be PTH vias that connect pins of component devices mounted on PCB 100. For purposes only of illustrating the disclosure, but not intended to limit embodiments, FIG. 1A, further depicts trace 106B connecting micro via 104A to component 108A, which can allow any electronic component connected electrically to trace 106A to also be electrically connected to any device electrically connected to component via 108A.

Figure 1B:
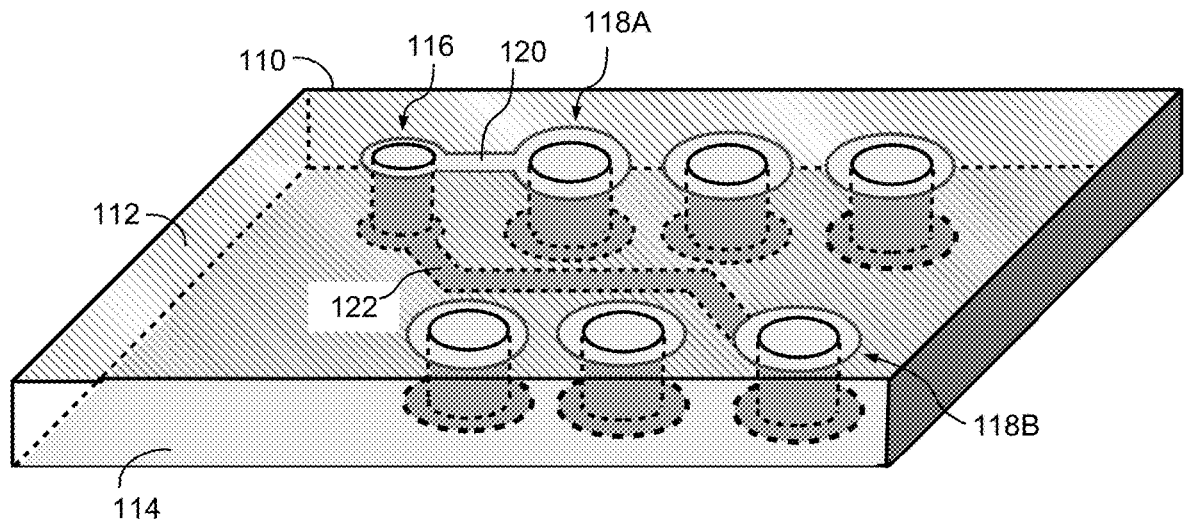
FIG. 1B illustrates example vias and traces in a printed circuit board, according to aspects of the disclosure.

FIG. 1B further illustrates an example of micro vias, in a PCB, interconnecting traces of one surface of a substrate with traces of another layer of a substrate (in the example of FIG. 1B, but not intended to limit embodiments, two surfaces of the same substrate layer). FIG. 1B depicts an orthogonal view of example PCB substrate layer 110 (which can be a representative portion of an example PCB) having example component and micro vias, and example traces on both top and bottom surfaces of substrate 110.

In FIG. 1B, via 118A can be, for example, a component via and is depicted, in FIG. 1B, as connected to via 116 by means of trace 120 on top surface 112 (indicated in FIG. 1B by cross-hatching) of substrate 110. As also shown in FIG. 1B, via 116 can be a micro via to connect trace 122 and, correspondingly, via 118B (which can be another component via), by means of trace 122 on bottom surface 114 (indicated in FIG. 1A by 1 shading) of substrate 110. While not shown in the example of FIG. 1B, in an embodiment, vias (such as 116, 118A. and/or 118B) can be blind vias that do not propagate completely through a substrate layer, such as 110, or, alternatively, through all successive layers of a multi-layer PCB.

A via—such as a micro-via, blind via, or component via, and having any particular geometry—can develop a defect in a conductive region of the via. For example, as a result of, or subsequent to, an electro-plating process forming the conductive material within a vial of a PCB, a via can develop a fissure, break, or other conductive discontinuity in a conductive surface, or element, of the via. Such defects in a via can be the result of, for example, a manufacturing process problem, and/or thermal or mechanical stresses, during or following manufacture of a PCB.

Such a defect can render a via non-conductive or, alternatively, only partially conductive. In embodiments, a via can be non-conductive if a defect creates an open-circuit within the via (e.g., between a connection on one surface of a substrate layer and a connection on another surface of that or a different substrate layer). A via, in an embodiment, can be partially conductive if, for example, a defect reduces the amount of electrical current that can pass through the via, or the via performs within electrical tolerances only intermittently (e.g., at only particular temperatures at which a conductive material expands or contracts a defect).

Figure 1C:
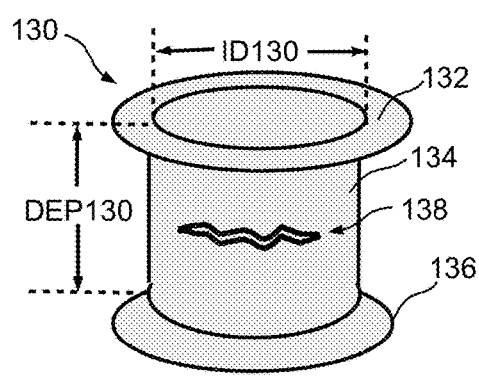
FIG. 1C illustrates an example defective via in a printed circuit board, according to aspects of the disclosure.

FIG. 1C illustrates an example of a defect in a via. In FIG. 1C, example via 130 comprises conductive regions 132, 134, and 136. FIG. 1C further illustrates via 130 having an inner diameter ID130 and a depth DEP130. In an embodiment, ID130 can be a diameter sufficiently large to insert a component pin, or to form a micro-via, and DEP130 can be the thickness of one or several substrate layers comprising a PCB. In embodiments, region 132 of via 130 can conductively connect, for example, to a trace on a surface (e.g., the top surface) of a PCB substrate layer; region 136 can conductively connect to another surface (e.g., the bottom surface) of that, or a different, substrate layer, and region 134 can conductively connect 132 and 136 through one or more substrate layers of a PCB.

As shown, in FIG. 1C, in embodiments region 136 can have a cylindrical geometry connecting 132 and 136 into, or through, one or more substrate layers of a PCB. However, this is not intended to limit embodiments and it would be apparent to one of ordinary skill in the art that conductive regions of a via, such as a region passing into or through a substrate layer, can have other geometries, and/or may incompletely cover internal surfaces of a via hole in one or more substrate layers. For example, as previously described a via hole can have a rectilinear geometry and a conductive region of a via can extend over one or several, but not all, internal faces of that via hole (i.e., faces of the via hole internal to a substrate layer). Similarly, a conductive region of a via can extend over only a fraction of the circumference of an interior region of a cylindrical via hole.

As previously described, a defect in a conductive region of a via, such as illustrated by defect 138 in via 130 of FIG. 1C, can degrade the conductive properties of that via. A PCB containing one or more defective vias can itself be considered defective, as a whole, and can lead to discarding such a defective PCB. Accordingly, repairing defective vias can reduce cost associated with discarding PCBs having defective vias.

Embodiments can repair a defective via utilizing a "repair coil" and a heating element. In embodiments, a repair coil can have a bonding material coating, or otherwise disposed upon, the coil to bond (electrically and/or mechanically) the repair coil to the via. For example, a repair coil can be coated with a bonding material (e.g., an electrical solder) that can electrically (and/or mechanically) bond the repair coil to conductive surfaces of a via. In embodiments, heating a repair coil, with the coil inserted into a through-hole (e.g., a via), can liquify the bonding material coating the repair coil such that the bonding material bonds the repair coil to surfaces of the through-hole. For example, a heating element can liquify electrical solder (hereinafter, for brevity, "solder"), coating a repair coil to bond the repair coil to surfaces (e.g., conductive surfaces) of a via.

FIGS. 2A-3D illustrate example repair coils and heating elements that can be utilized to repair a defective through-hole, such as a via in a PCB. In the description of FIGS. 2A-3D that follow, it will be understood that, as example embodiments, the descriptions of these example implicitly incorporate the phrase "in embodiments", without the necessity of repeating this phrase to introduce and/or qualify each aspect or element of the examples of FIGS. 2A-3D as being an aspect or element of an embodiment. For example, in the description of FIGS. 2A-3D, a statement such as "a repair coil can comprise . . . ", or "a heating element can do . . . " implicitly incorporates the phrase "in an embodiment", such as "in an embodiment, a repair coil can comprise . . . ", or "in embodiments, a heating element can do . . . ".

Figure 2A:
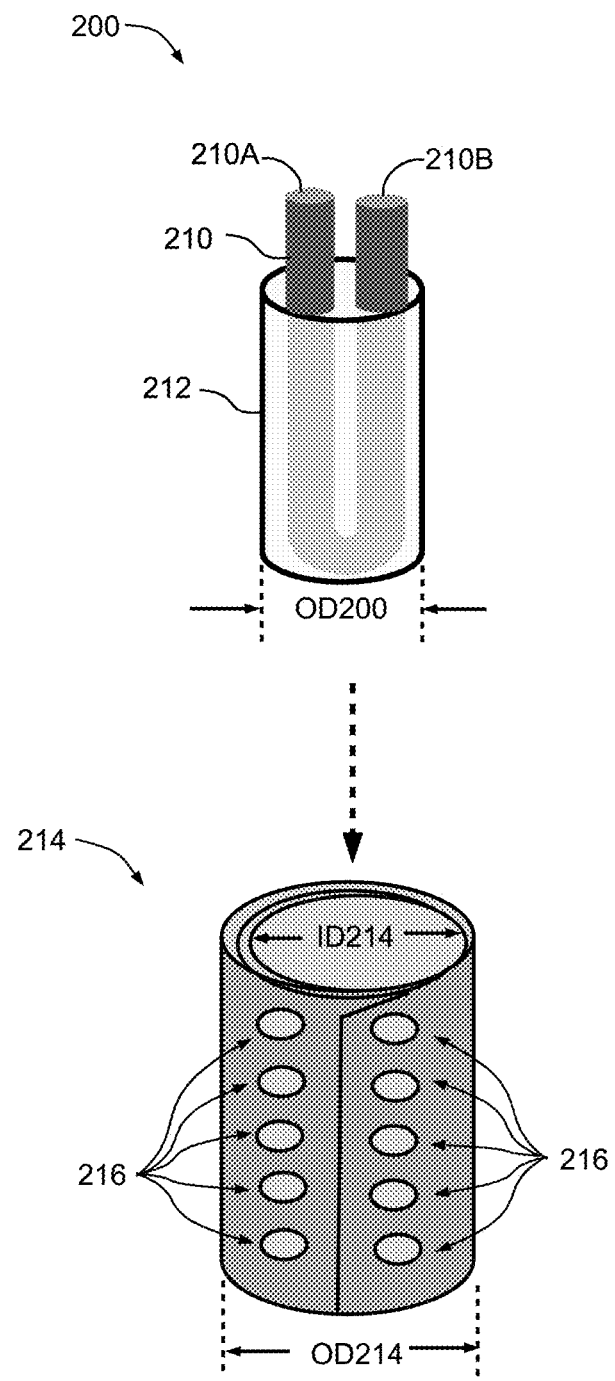
FIG. 2A illustrates an example heating element and repair coil, according to aspects of the disclosure.

FIG. 2A depicts an example embodiment comprising repair coil 214 and heating element 200. A repair coil, such as 214, can comprise a "repair strip" of a conductive material formed into a coil geometry (as used hereinafter, "coil" implies a coil geometry) by winding turns of the repair strip around an inner diameter. A repair coil can comprise, for example, turns of a repair strip of pure copper, or a copper alloy (e.g., beryllium-copper alloys C17200 or C15000), wound into a coil.

A repair strip can have a width of approximately the depth of a though-hole (e.g., depth DEP130 of via 130 in FIG. 1C) into which the repair coil will be inserted and can have a length sufficient to form turns of the strip into a coil. Turns of a repair strip can form a repair coil having a particular outer coil diameter and inner coil diameter, such as OD214 and ID214, respectively, of repair coil 214 in FIG. 2A. A repair coil can have an outer coil diameter less than an inner diameter of a though-hole into which the repair coil will be inserted. For example, in FIG. 2A repair coil 214 can be designed to repair a via such as 130 in FIG. 1C. Accordingly, OD214 of repair coil 214 can be less than via inner diameter ID130 of via 130 such that repair coil 214 can be inserted into a via having an inner diameter equal to, or larger, than, ID130.

A repair coil, and/or a repair strip forming a repair coil, can be coated, or disposed, with a bonding material, such as solder and/or adhesive, that can be liquefied, with the repair coil inserted into a through-hole (e.g., a via), to electrically, and/or mechanically, bond the repair strip of the coil to the material of the through-hole. A repair strip of a repair coil can have a bonding material coating, or otherwise disposed upon, both surfaces of a repair strip, upon only the inside (facing toward the center of the coil) or only the outside (facing away from the center of the coil) surface of the repair strip, or upon the repair coil as a whole. For example, with reference again to FIG. 2A, a repair strip forming repair coil 214 can be coated with liquid (e.g., molten) solder (not shown in FIG. 2A) on one or both surfaces of the repair strip, and the strip then wound into a coil geometry. Alternatively, the repair strip can be wound into a coil and the coil as a whole coated, or disposed with, liquid solder. While in a coil geometry, the liquid solder can be subsequently allowed to solidify upon, or around the turns of the repair strip forming the coil.

A repair strip of a repair coil, such as 214, can be "tightly-wound", such that the turns of a repair strip forming the coil are under outward, "expansive", stress around the center of the coil, and the expansive stress can tend to unwind, or "expand", the turns of the repair strip outward (i.e., towards the outer diameter of the repair coil). A repair strip forming a repair coil can have a length of the strip sufficient to form a number of turns (e.g., 2 or 3 turns) that can create the expansive stress of a tightly-wound coil.

Solidified bonding material deposited on, or coating, a repair coil can maintain the repair strip in a tightly-wound coil. For example, while in a tightly-wound geometry repair coil 214 (and/or a repair strip forming repair coil 214) can be coated, or otherwise deposited, with liquid solder. Subsequently allowing the solder to solidify (e.g., by cooling the solder disposed on the tightly-wound coil) can maintain repair coil 214 in a tightly-wound coil under expansive stress. Inserting repair coil 214, with the solder solidified on the coil, into a through-hole and heating repair coil 214 can liquify the solder to release the expansive stress of repair coil 214 and allow repair coil 214 to expand within the through-hole.

A repair strip held in a tightly-wound coil can undergo "stress-relaxation", in which the material of the repair strip relaxes the expansive stress of the coil such that, when a force maintaining the repair strip as a tightly-wound coil is removed (e.g., solidified solder is liquified), the repair strip remains coiled and does not expand. Some materials can undergo stress-relaxation more quickly at higher temperatures, such as a temperature of a liquefied (e.g., molten) solder applied to a tightly-wound repair strip of a repair coil. Accordingly, in embodiments a repair-strip material that does not undergo, or resists, stress-relaxation at temperatures about (e.g., at or above) a melting temperature of a bonding material, such as a solder, can maintain expansive stress of a repair coil at temperatures at which the bonding material is liquefied and applied to the repair coil.

For example, a solder can have a melting point of 200 degrees Celsius and can be applied to a repair coil to maintain a repair strip in a tightly-wound coil when the applied solder is solidified (e.g., at temperatures below 200 degrees Celsius). Beryllium-copper (Be—Cu) alloys C17200 or C15000, for example, can resist, or undergo little, stress-relaxation at temperatures of about 200 degrees Celsius. Accordingly, applying liquid solder to a repair strip of such a Be—Cu alloy, at about a melting temperature of the solder (e.g., about 200 degrees Celsius), can maintain the expansive stress of the tightly-wound coil after the solder has solidified on, or around, the repair coil.

As just described, heating a repair coil, such as 214 in FIG. 2A, can liquefy bonding material (e.g. solder) disposed on the coil and the liquified bonding material can allow the repair coil to expand against the inner surface(s) of a through-hole, such as a via, and/or bond the repair coil to the through-hole. Accordingly, embodiments can insert a repair coil into a through-hole (e.g., a via) and utilize a heating element, such as heating element 200 in FIG. 2A, inserted into the repair coil to heat the repair coil and/or bonding material disposed on or, coating, the repair coil.

A center of a repair coil (e.g., the center of the turns of a repair strip forming a repair coil) can have an inner diameter sufficient to insert a heating element into the repair coil. For example, in FIG. 2A repair coil 214 is shown having a center of inner diameter ID214, and heating element 200 is illustrated having outer diameter OD200 (e.g., an outer diameter of the combination of repair coil 214 and a bonding material disposed thereon). In an embodiment, ID214 of the center of repair coil 214 can be larger than the OD200 of heating element 200, such that heating element 200 can be inserted into the center of repair coil 214.

While FIG. 2A depicts heating element 200 having a rounded (circular, or ovoid) lateral geometry, this is not intended to limit embodiments. It would be apparent to one of ordinary skill in the art that a heating element designed to insert into a repair coil can have geometries other than circular (e.g., rectilinear), and that such an alternative geometry of a heating element can have lateral dimensions other than a diameter (e.g., a length or width) that can be less than an inner diameter of a repair coil to enable insertion of the heating element into the repair coil.

A heating element, inserted into a repair coil, can heat the repair coil to liquefy a bonding material coating the repair coil and maintaining the expansive stress of the coil. Liquefying the bonding material can release the force maintaining the repair coil in a tightly-wound coil to allow the coil to expand within the through-hole, and/or to bond (e.g., electrically and/or mechanically) the repair coil to surfaces of the through-hole (e.g., the inner surface of region 134 of via 130 in FIG. 1C).

To illustrate, FIG. 2A depicts heating element 200 comprising heating wire 210 (hereinafter, for brevity, "wire 210) and insulator 212 enclosing a segment of wire 210 formed as a partial loop within insulator 212. As previously described, a heating element can have a geometry such that the heating element can be inserted into a repair coil. For example, as illustrated in FIG. 2A, heating element 200 can have an outer diameter, OD200, of insulator 212 that is less than the inner diameter, ID214, of repair coil 214 such that heating element 200 can be inserted into the center of repair coil 214.

Wire 210 can be a conductive material (e.g., nichrome) that, when an electrical current passes through it, wire 210 (or, alternatively, the segment of wire 210 enclosed within insulator 212) heats (e.g., by joule heating). For example, ends 210A and 210B of wire 210 can be connected to an electrical current source to pass current through wire 210, causing wire 210 to heat. With repair coil 214 inserted into a through hole (e.g., a via) and heating element 200 inserted into the center of repair coil 214, a current passing through wire 210 can heat repair coil 214 and liquefy solder coating the coil. With the solder liquefied, repair coil 214 can expand within the through-hole. Subsequently allowing the solder to solidify (e.g., by removing the current from wire 210, or by other means allowing the heating element and/or solder to cool) can bond (electrically and/or mechanically) the expanded repair coil 214 (e.g., surfaces of a repair strip forming repair coil 214) to the through-hole.

Insulator 212 can enclose or encapsulate surfaces, or segments, of wire 210 so as to electrically (and/or mechanically) insulate wire 210 from a bonding material coating a repair coil, and/or the material of the repair coil (e.g., copper) itself. Insulator 212 can be of a material (e.g., a glass or mylar) that does not adhere to solder (and/or another bonding material), so as to facilitate removing heating element 200 from a repair coil after solder liquefied by heating element 200 has subsequently solidified within a through-hole. In an embodiment removing a heating element from a repair coil, in conjunction with, or subsequent to, liquefying a bonding material disposed on the repair coil, can facilitate re-use of the heating element. Such a removable heating element can be re-used, for example, with additional repair coils to repair additional defective through-holes. Additionally, expanding repair coil 214, within a through-hole, can expand the inner diameter of repair coil 214 such that the inner diameter of the coil exceeds the outer diameter of heating element 200, which can facilitate removing heating element 200 from within repair coil 214 subsequent to liquefying bonding material disposed on repair coil 214.

Alternatively, heating element 200 can be designed to remain in place within a repair coil, in conjunction with, or subsequent to, liquefying a bonding material disposed on the repair coil. For example, heating element 200 can have wire 210 and insulator 212 extending only slightly above a surface of through-hole, such that after heating element 200 liquifies a bonding material coating a repair coil, and the bonding material has subsequently solidified within the through-hole, heating element 200 can be left in place within the repair coil and solidified bonding material. For example, wire 210 can be cut, or otherwise disconnected, from a current source utilized to heat heating element 200, to leave heating element 200 within the repair coil and solidified bonding material.

As illustrated in FIG. 2A, a repair strip forming a repair coil, such as 214, can include perforations, such as 216. Such perforations can facilitate the flow of bonding material, or other materials released in conjunction with heating the repair coil, around the repair strip and/or within the through-hole. For example, repair coil 214 can be coated with solder and, when heating repair coil 214, perforations 216 can improve the flow of the liquefied solder from repair coil 214 to a through-hole, and/or the flow of solder flux away from the through-hole and/or repair coil 214. Such perforations can have a geometry (e.g., oval, circular, or rectilinear), and can be of a plurality, location, and size (e.g., diameter), within a repair strip to achieve desirable flow of such materials from, or between, the repair coil and/or the through-hole.

Figure 2B:
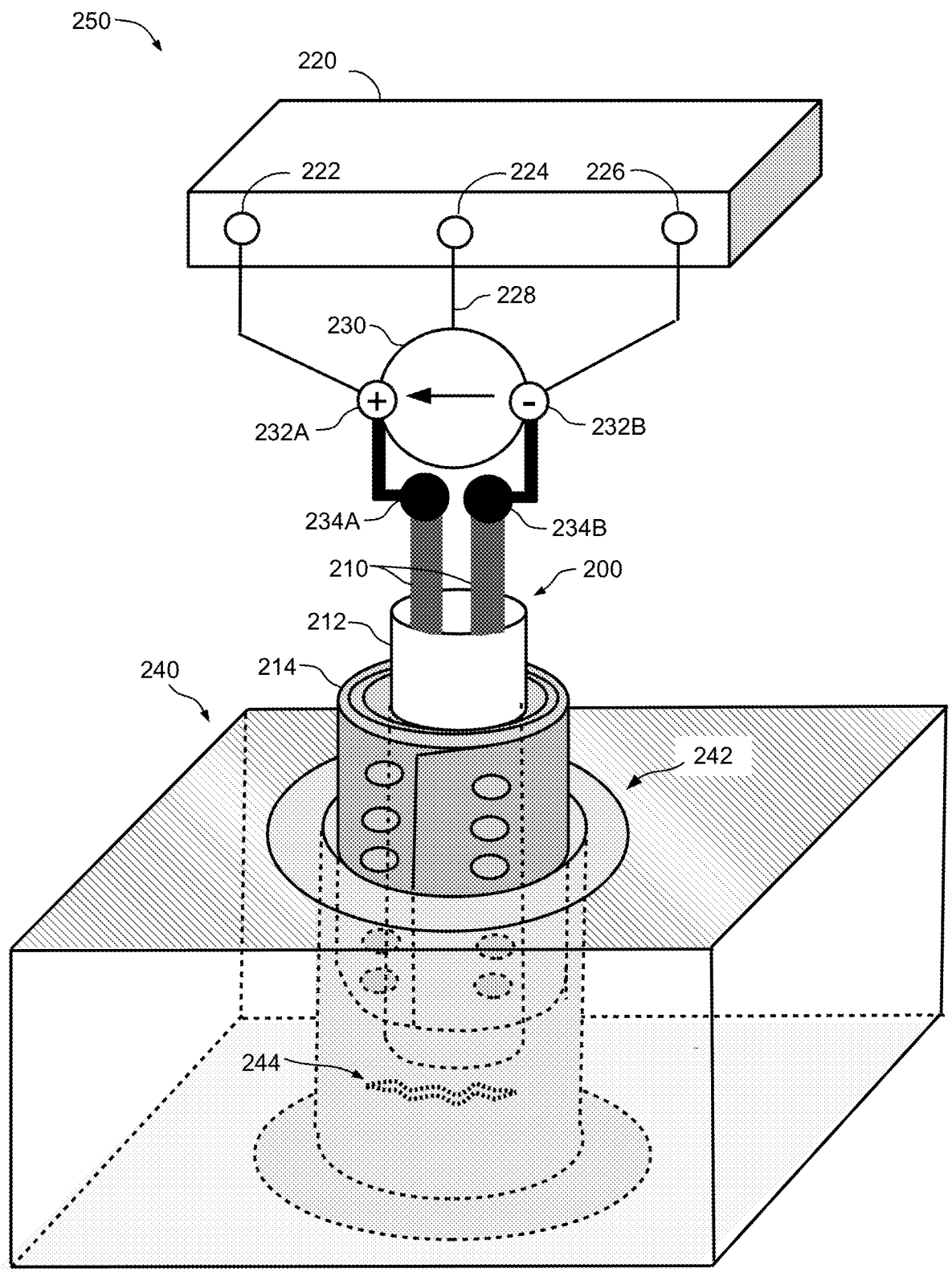
FIG. 2B illustrates an example system for repairing a defective via, according to aspects of the disclosure.

FIG. 2B depicts an example through-hole repair assembly utilizing the foregoing example of repairing a via in a PCB. To illustrate the example of FIG. 2B, but not intended to limit embodiments, via repair system 250, of FIG. 2B, is described as utilizing heating element 210 and repair coil 214, of FIG. 2A, to repair a via in a PCB.

FIG. 2B depicts via repair system 250 to repair via 242, in PCB substrate layer 240, having defect 244 in a cylindrical conductive wall of via 242. Via 242 can be, for example, a PTH via, such as a micro via, blind via, a component via, and/or as illustrated by via 130 in FIG. 1C. FIG. 2B further depicts repair coil 214 of FIG. 2A inserted into via 242, and heating element 200 of FIG. 2A inserted into repair coil 214. As previously described, heating coil 214 can comprise a solder-plated conductive strip tightly-wound into a coil having a coil outer diameter less than the inner diameter of via 242.

As previously described in reference to FIG. 2A, an electrical current passing through wire 210 can cause wire 210 to heat, and the heat can, in turn, liquefy solder coating repair coil 214, allowing repair coil 214 to expand within via 242 and the solder to flow from repair coil 214 to via 242 to electrically bond repair coil 214 to via 242. Perforations in repair coil 214, such as shown by 216 in FIG. 2A, can improve the flow of solder and/or solder flux from repair coil 214. While not shown in FIG. 2B, in an embodiment "flooding", or otherwise inundating, via 242 with an inert gas (e.g., argon), while liquifying solder coating repair coil 214, can also improve the flow of solder from repair coil 214 to via 242, and/or removal of solder flux from the repair coil and via.

Via repair assembly 250 further includes current source 230 for producing a current in wire 210 of heating element 200. In FIG. 2B, the ends of wire 210 protruding from heating element 200 connect to contacts 234A and 234B, connected respectively to positive polarity terminal 232A and negative polarity terminal 232B of current source 230. Current source 230 can provide a fixed amount of current. For example, current source 230 can comprise a DC battery passing a current through wire 210 proportional to the battery voltage divided by the resistance of wire 210.

Alternatively, and as shown in FIG. 2B, current source 230 can be a variable current source, in which the current passed through wire 210 is determined by a current controller, shown in FIG. 2B as controller 220. In an embodiment, a variable current source can determine an amount of current provided to a heating element, such as 200 in FIG. 2B, to control the temperature of wire 210, in FIG. 2B, so as to correspondingly control liquification and/or flow of solder from a repair coil to surfaces of a through hole. To illustrate, FIG. 2B further shows controller 220 having positive polarity input 222 connected to current source 230 positive polarity terminal 232A and negative polarity input 226 connected to current source 230 negative polarity terminal 232B. Using voltage and/or current measurements, for example, at inputs 222 and/or 226, controller 220 can adjust, using output 228 from control terminal 224 to current source 230, the magnitude and/or duration, for example, of a current that current source 230 passes through wire 210 to liquefy solder coating repair coil 214.

In FIG. 2B, insulator 212 of heating element 200 can electrically insulate wire 210 from a repair strip forming repair coil 214, solder disposed on repair coil 214, and/or conductive surfaces of via 242. Insulator 212 can, additionally or alternatively, prevent adhesion of heating element 200 such that, subsequent to liquefying solder disposed on repair coil 214, heating element 200 can be removed from (e.g., withdrawn from the center of) repair coil 214.

Figure 2C:
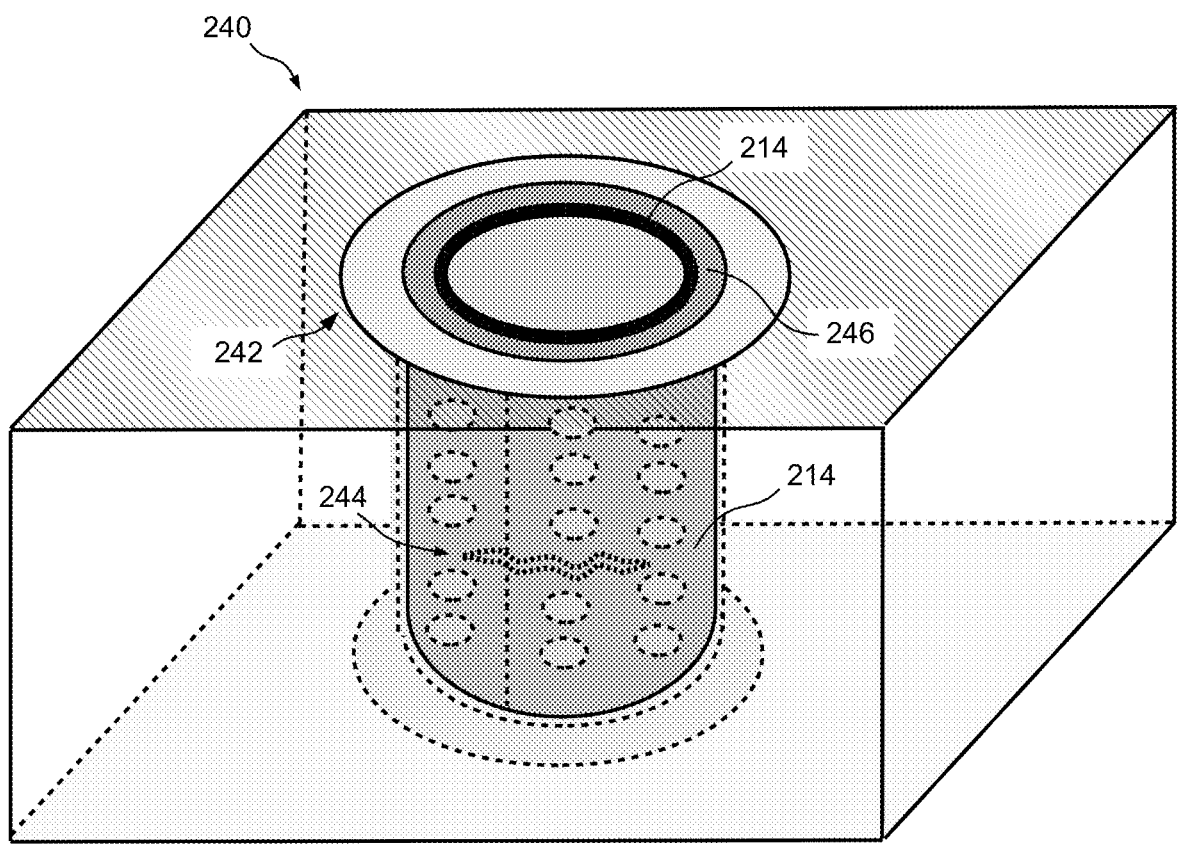
FIG. 2C illustrates an example repaired via, according to aspects of the disclosure.

FIG. 2C illustrates the example of via 242 FIG. 2B, following repair of via 242 in substrate 240 using through-hole repair assembly 250 in FIG. 2B. In FIGS. 2B and 2C, repair coil 214 can have a height corresponding to or, alternatively, less than the depth of via 242, such that repair coil 214 can be fully inserted into via 242 and to not protrude above (and/or below) substrate 240. Subsequent to liquifying solder, indicated in FIG. 2C as 246, coating repair coil 214, using example through-hole assembly 250 of FIG. 2B, solder 246 can solidify to form an electrical and, optionally, mechanical bond between repair coil 214 and via 242 repairing defect 244. FIG. 2C depicts repair coil 214 expanded against the cylindrical inner surface of via 242 and bonded to via 242 by solder 246 having been liquefied by heating element 200 and, subsequently, solidified between repair coil 214 and via 242. An electrically conductive bond between via 242 and repair coil 214 can, then, substitute for a conductive discontinuity in the via resulting from defect 244.

As previously described, a heating element can be removed from a repair coil following repair of a via, such as in conjunction with, or subsequent to, liquifying solder coating a repair coil (e.g., while the solder is still liquefied or, alternatively, after it has subsequently solidified). Accordingly, FIG. 2C illustrates via 242 with repair coil 214 bonded within the via and heating element 200 removed from repair coil 214 and via 242 subsequent to heating element 200 liquefying the solder. Alternatively, while not shown in FIG. 2C, and as also previously described, an embodiment can leave a heating element in place, within a repair coil and via, subsequent to liquefying (and/or solidifying) solder disposed on the repair coil.

Figure 3A:
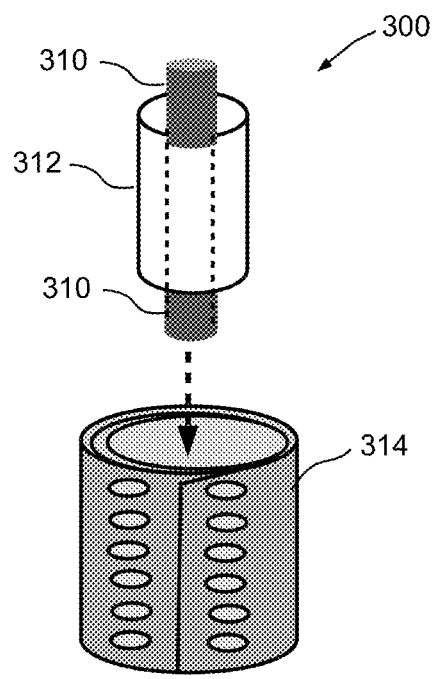
FIG. 3A illustrates an alternative example heating element and repair coil, according to aspects of the disclosure.

FIG. 3A illustrates an alternative example heating element. In FIG. 3A, heating element 300 comprises wire 310 and insulator 312 enclosing a segment of wire 310. As previously described with reference to FIG. 2A, wire 310 can comprise a conductive material (e.g., nichrome) that can generate heat when an electrical current passes through it. Similarly, as also described previously in reference to FIG. 2A, insulator 312 can comprise a glass or plastic material, and can comprise a material that does not adhere to a liquid and/or solid bonding material (e.g., solder) disposed on a repair coil.

Heating element 300, in FIG. 3A, differs from heating element 200, in FIG. 2A, in that in heating element 300 wire 310 passes through insulator 312, in contrast to wire 210 of heating element 200 being contained within insulator 212 as a loop of wire 210. As shown in FIG. 3A, heating element 300 can be inserted into a repair coil, shown in FIG. 3A as repair coil 314. Repair coil 314 can be similar to repair coil 214 of FIG. 2A and can comprise a tightly-wound repair strip, and the repair strip and/or repair coil 314 as a whole can be coated or, disposed, with a bonding material, such as solder. Bonding material disposed on the repair strip and/or repair coil can maintain the repair strip as a tightly-wound coil under expansive stress.

When inserted into a repair coil, such as 314, heating element 300 can extend through the center of the repair coil with the repair coil inserted into a through-hole passing through a substrate layer. For example, repair coil 314 can be inserted into a via, such as 242 of FIG. 2B, passing through a substrate layer of a PCB, with heating element 300 inserted into repair coil 314. A current source can be connected to each end of wire 310 passing through the repair coil and via, and the current source providing an electrical current through wire 310 can cause wire 310 to heat and liquify solder coating repair coil 314 to slow repair coil 314 to expand within the via and/or bond repair coil 314 to surfaces of the via, such as previously described. Expanding repair coil 314 can expand the inner diameter of repair coil 314 such that the inner diameter of the coil exceeds the outer diameter of heating element 300, which can facilitate removing heating element 300 from within repair coil 314 subsequent to liquefying bonding material disposed on repair coil 314.

Figure 3B:
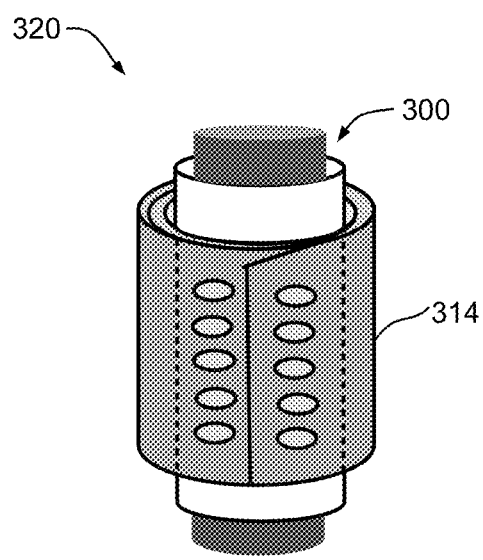
FIG. 3B illustrates the alternative example heating element of FIG. 3A inserted into a repair coil, according to aspects of the disclosure.

FIG. 3B illustrates an example through-hole repair element that combines a heating element and repair coil. In FIG. 3B, through-hole repair element 320 comprises a combination of heating element 300 and repair coil 314 of FIG. 3A. In FIG. 3B, repair coil 314 can be tightly wound around heating element 300 to form through-hole repair element 320. In embodiments through-hole repair element 320 can be inserted into a through-hole, such as 242 of FIG. 2B. An electrical current passing through wire 310 of heating element 312, as embodied in through-hole repair element 320, can heat repair coil 314, as embodied in through-hole repair element 320, to liquify bonding material, such as solder, coating repair coil 314. In through-hole repair element 320, liquifying the bonding material can enable repair coil 314 to expand against surfaces of through-hole and subsequently solidifying the bonding material can bond repair coil 314 of via repair element 320 to surfaces of the through-hole.

As previously described with reference to FIG. 2A, an insulator of a heating element can encapsulate (or, surround) surfaces, or regions, of a heating wire so as to insulate (electrically and/or mechanically) the heating wire from bonding material (e.g., solder) coating a repair coil, and or material of the repair coil itself. As illustrated in the example of FIG. 3A, insulator 312 can surround a region of wire 310 that extends through repair coil 314, and/or a through-hole into which the combination of heating element 300 and repair coil 314 is inserted. Similarly, as illustrated in FIG. 3B, insulator 312 of heating element 300, in via repair element 320, can surround a region of wire 310 of heating element 300, in via repair element 320, that extends through repair coil 314 of via repair element 320.

Figure 3C:
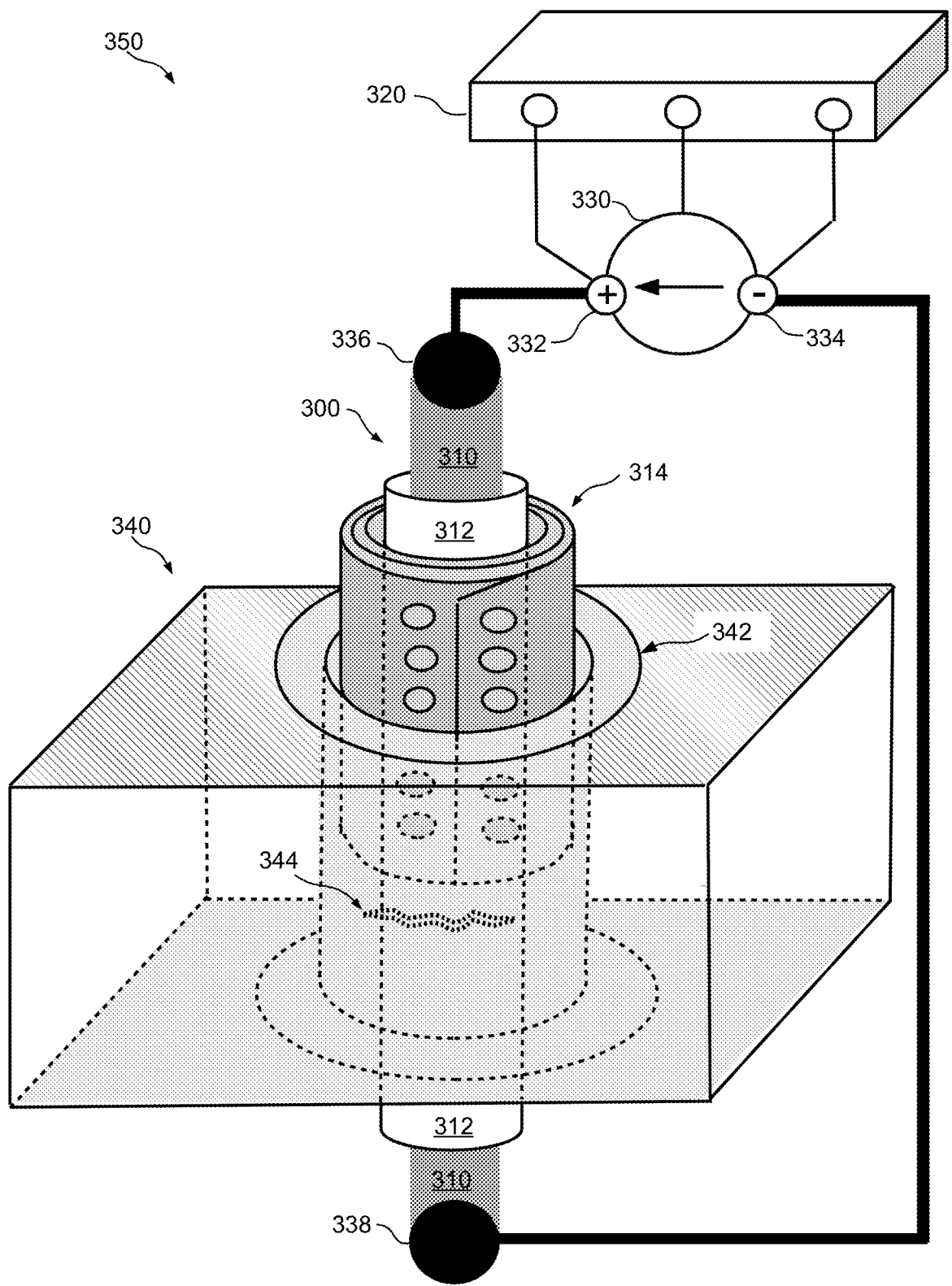
FIG. 3C illustrates an alternative example system for repairing a defective via, according to aspects of the disclosure.

FIG. 3C illustrates an example through-hole repair assembly, which can be similar to the example of FIG. 2B, to repair a defective through-hole. To illustrate the example, but not intended to limit embodiments, in FIG. 3C example through-hole repair assembly 350 utilizes the example heating element 300 and repair coil 314 of FIG. 3A (alternatively, in the example of through-hole repair assembly 350, through-hole repair element 320, of FIG. 3B, could substitute for the combination of heating element 300 and repair coil 314 of FIG. 3A).

FIG. 3C illustrates via 342 in substrate 340 having defect 344, which can be similar to defect 244 of FIG. 2C, such as a fissure, break, or other conductive discontinuity in a conductive surface of via 342 (as shown in FIG. 3C, in the conductive cylindrical surface of via 342). FIG. 3C further illustrates repair coil 314, of FIG. 3A, inserted into via 342 and heating element 300 inserted into repair coil 314. Wire 310, of heating element 300, connects to current source 330 positive polarity terminal 332 by contact 336, and to current source 330 negative polarity terminal 334 by contact 338. Current source 330 can be a variable current source and controller 320 can control electrical current passed from current source 330 through wire 310, such as in the manner previously described with reference to current source 230 and controller 220 of FIG. 2B.

An electrical current from current source 330 through wire 310, in FIG. 3C, can operate as previously described with reference to FIG. 3A, to heat and liquify solder coating repair coil 314 to allow repair coil 314 to expand within via 342 and to bond repair coil 314 to via 342. Subsequent to liquefying solder disposed on repair coil 314, an embodiment can disconnect wire 310 (e.g., at contacts 336 and 338) and the liquid solder can be allowed to solidify within via 342.

Also, subsequent to liquefying the solder, an embodiment can remove heating element 300 from repair coil 314 and via 342. Expanding repair coil 314 can enlarge the inner diameter of repair coil 314 to greater than the outer diameter of heating element 300, to facilitate removing heating element 300 from the repair coil 314, inserted within via 342, subsequent to liquefying solder disposed on repair coil 314. Additionally, or alternatively, properties of insulator 312 surrounding wire 310, in heating element 314 of FIG. 3C, can facilitate removing heating element 300 from the repair coil 314 subsequent to liquefying solder disposed on repair coil 314.

Figure 3D:
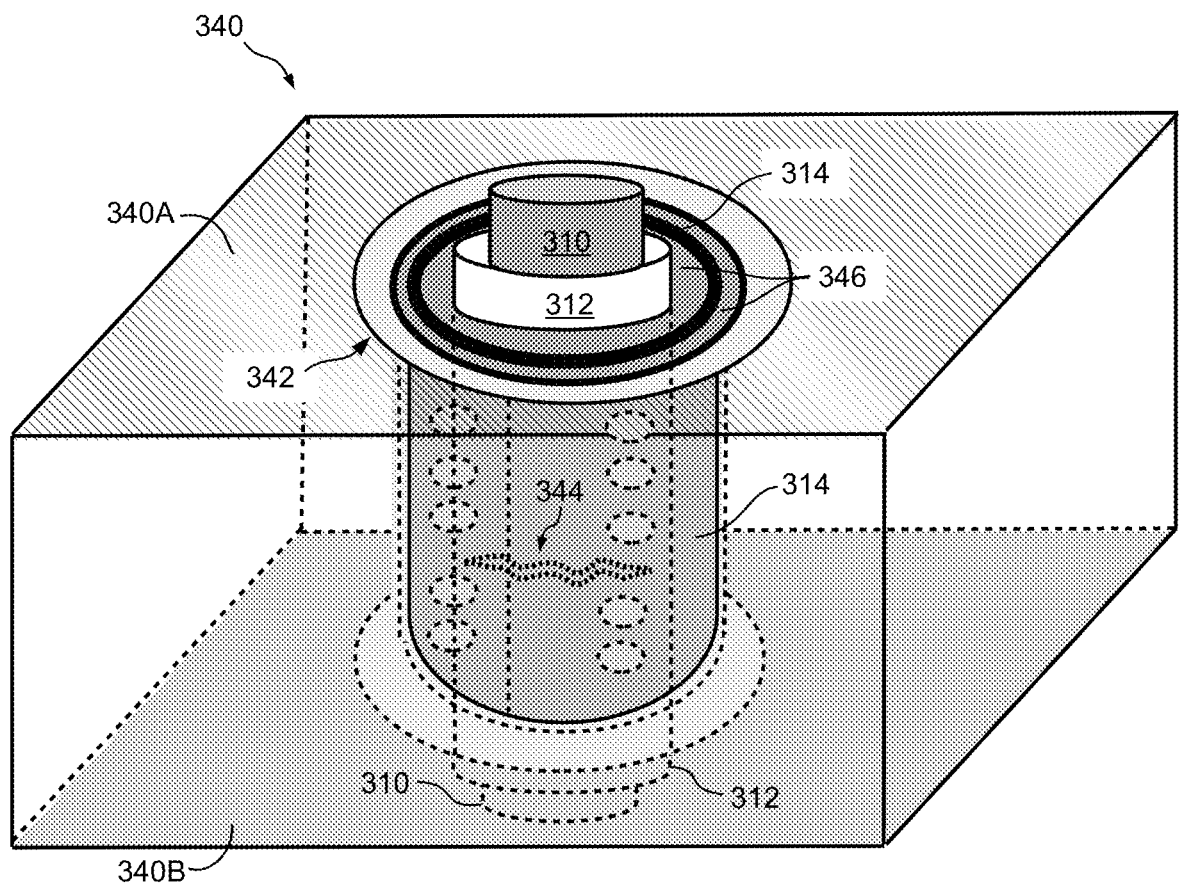
FIG. 3D illustrates an example of a heating element left in-place within a repaired via, according to aspects of the disclosure.

In an alternative embodiment, subsequent to liquefying solder disposed on repair coil 314, an embodiment can leave heating element 300 in place within repair coil 314 in via 342. FIG. 3D depicts the example substrate 340 and via 342, of FIG. 3C, subsequent to heating element 300 liquefying solder, indicated in FIG. 3D by 346, disposed on repair coil 314. In FIG. 3D, wire 310 is depicted disconnected from a current source (such as 330 of FIG. 3C) subsequent to heating element 300 liquefying solder 346. FIG. 3D further depicts wire 310 and insulator 312 mechanically bonded in-place within repair cold 314 by solder 346, such as in the case that solder 346 bonding repair coil 314 to via 342 also mechanically bonds insulator 312 and/or wire 310 to repair coil 314 and/or via 342. In embodiments, wire 310 and/or insulator 312 can be cut so as to not extend beyond (or, to extend minimally beyond) top surface 340A, and/or bottom surface 340B, of substrate layer 340.

Figure 4:
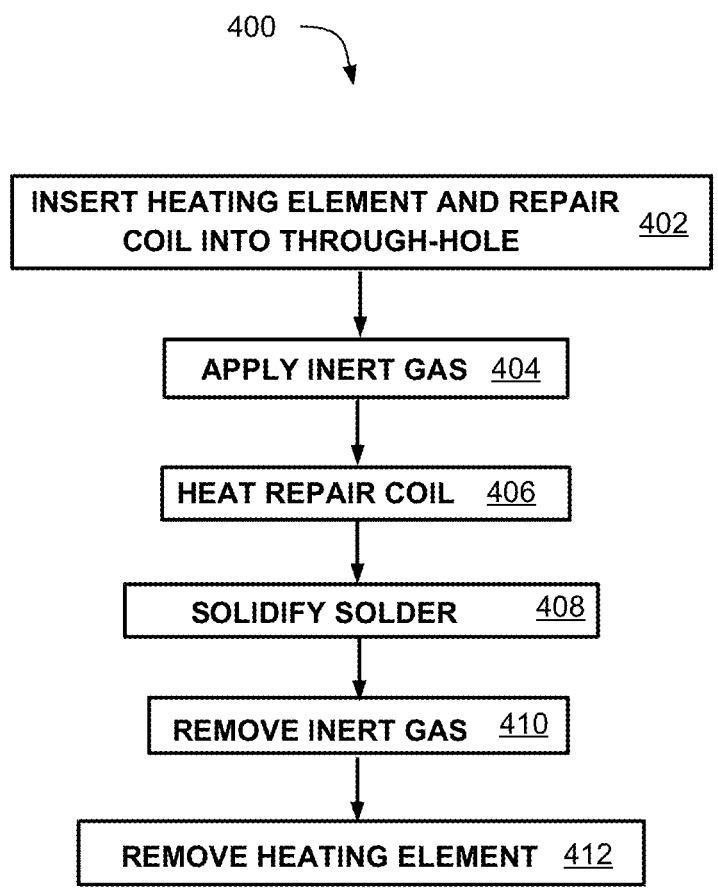
FIG. 4 is a flowchart that illustrates an example method of repairing a defective via, according to aspects of the disclosure.

Embodiments can include a method of repairing a defective through-hole, such as example method 400 shown in FIG. 4. In embodiments methods, such as example method 400, can utilize through-hole repair assemblies, structures, and/or devices such as those of the examples of FIGS. 2A-3D. Accordingly, for purposes only of illustrating the method, but not intended to limit embodiments, method 400 is described herein as performed utilizing a through-hole repair assembly comprising structures and devices such as in the examples of FIGS. 2A-3D.

With reference to FIG. 4, at 402 a through-hole repair assembly inserts a heating element and repair coil into a defective through-hole (e.g., a defective via of a PCB). As previously described with reference to FIGS. 2A, 3A, and 3B in embodiments the repair coil can be a tightly-wound coil disposed with a bonding material, such as a solder. Also as previously described, with reference to FIGS. 2B and 3C, in embodiments the repair coil can be inserted into the repair coil and the combination of heating element and repair coil inserted into the through-hole.

At 404, the through-hole repair assembly optionally inundates (or, "floods") the through-hole, and/or substrate containing the through-hole, with an inert gas (e.g., argon). As previously described, flooding the through-hole with an inert gas can facilitate flow of bonding material(s) (e.g., solder and/or solder flux) from the repair coil and through-hole, and/or between the repair coil and through-hole.

At 406, the through-hole repair assembly heats the heating element, liquifying the bonding material coating the repair coil, allowing the repair coil to expand within the through-hole and/or to bond the repair coil to surfaces (e.g., conductive surfaces) of the through-hole. As previously described, in embodiments a heating element can comprise an insulated wire and a current through the wire can cause the heating element to heat the repair coil surrounding the heating element within the through-hole.

At 408, the through-hole repair assembly discontinues heating the repair coil (e.g., discontinues passing a current through a wire of the heating element), and allows the liquefied bonding material to solidify, completing the process of bonding the repair coil to the through-hole and repairing the through-hole defect. If, at 404, the through-hole repair assembly had performed the optional operation to flood the through-hole with an inert gas, at 410 the through-hole repair assembly can remove (e.g., evacuate) the inert gas from the through-hole and/or substrate containing the through-hole.

At 412, the through-hole repair assembly can, optionally, remove the heating element from the through-hole. As previously described, in embodiments a heating element can comprise an insulating material, surrounding surfaces of a heating wire that can contact a repair coil and/or bonding material coating a repair coil, that does not adhere to the solidified bonding material and/or repair coil. Accordingly, at 412 the through-hole repair assembly can remove the heating element from the repair coil and through-hole subsequent to liquefying the bonding material disposed on the repair coil.

Alternatively, and as also previously described, in an embodiment the heating element can be formed of a material, and/or in a geometry, compatible with leaving the heating element in place subsequent to repairing the through-hole. In embodiments, a material compatible with leaving the heating element in place in the via can comprise, for example, an insulating material that adheres to the solidified bonding material and/or that does not affect other properties of the bonding material, repair coil, and/or through-hole (e.g., electrical conductivity). In embodiments, a geometry of a heating element compatible with leaving the heating element in place can comprise, for example, a geometry that does not extend beyond surfaces of a through-hole (e.g., a top and/or bottom surface of a substrate layer) in a manner that would impede normal use of a substrate containing that through-hole.

The descriptions of the various example embodiments have been presented for purposes of illustration but are not intended to be exhaustive, nor limited to the embodiments disclosed. Many modifications and variations will be apparent to those of ordinary skill in the art without departing from the scope and spirit of the described embodiments, and that the systems, devices, and methods of the disclosure, and/or their equivalents, can be applied to through-hole structures other than through-holes of a PCB, whether or not such structures are electrically conductive, and/or in applications other than through-hole structures, such as to make repairs of defects in other structures into which can be inserted a tightly-wound repair coil and heating element.

For example, it would be apparent to one of ordinary skill in the art that, in embodiments, a through-hole can comprise a channel, or pipe, for conveying a gas, or fluid, between, or among, substrates of a device or apparatus (e.g., a cooling element of a mechanical or computing device), and a defect in the through-hole can allow such gas or fluid to leak within, and/or from, the device or apparatus. A repair coil can comprise a tightly-wound coil formed of a material (e.g., rubber, or plastic) for sealing a defect in the channel against the gas, or liquid, leaking from the channel (or, alternatively, into the channel). A bonding material disposed on the repair coil (or, a repair strip forming the coil) can be a material, such as an adhesive, to bond the coil within the channel. The repair coil can be inserted into the channel and a heating element, inserted into the repair coil, can liquefy the bonding material to allow the coil to expand within the channel. Subsequently solidifying the bonding material, within the channel, can bond the repair strip within the channel to seal the defect against leaking the gas or fluid.

As this example illustrates, it will be understood by one of ordinary skill in the art that the examples of the disclosure do not limit embodiments to electrically conductive through-holes and/or applications of electrically conductive through-holes.

What is claimed is:

1. A method for repairing a defective through-hole, the method comprising:
    inserting a repair coil into the through-hole, the repair coil comprising a tightly-wound repair strip and a bonding material disposed upon the repair coil;
    inserting a heating element into the repair coil, the heating element comprising a segment of a heating wire enclosed within an insulating material;
    passing an electrical current through the heating wire to cause the segment of the heating wire to produce heat, the heat liquifying the bonding material to allow the repair coil to expand within the through-hole; and,
    solidifying the bonding material, within the through-hole, to bond the expanded repair coil to a surface of the through-hole.

2. The method of claim 1 further comprising, in conjunction with the heat liquifying the bonding material, applying an inert gas to the repair coil inserted into the through hole.

3. The method of claim 1 further comprising, subsequent to the heat liquifying the bonding material, removing the heating element from the repair coil.

4. The method of claim 1, wherein the repair strip comprises an electrically conductive material.

5. The method of claim 4, wherein the electrically conductive material comprises one of pure copper and a copper alloy.

6. The method of claim 5, wherein the copper alloy comprises one of Be—Cu alloy 15200 and Be—Cu alloy 17000.

7. The method of claim 1, wherein, the bonding material comprises at least one of an electrical solder and an adhesive material capable of forming a mechanical bond between the repair strip and the surface of the through-hole.

8. The method of claim 1, wherein the repair strip is tightly-wound around the heating element.

9. The method of claim 1, wherein the segment of the heating element enclosed within the insulating material further comprises one of a loop of the heating wire enclosed within the insulating material and a straight length of the heating wire enclosed within the insulating material.

* * * * *